United States Patent
Duggal

(10) Patent No.: US 6,465,953 B1
(45) Date of Patent: Oct. 15, 2002

(54) PLASTIC SUBSTRATES WITH IMPROVED BARRIER PROPERTIES FOR DEVICES SENSITIVE TO WATER AND/OR OXYGEN, SUCH AS ORGANIC ELECTROLUMINESCENT DEVICES

(75) Inventor: Anil Raj Duggal, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 225 days.

(21) Appl. No.: 09/592,076

(22) Filed: Jun. 12, 2000

(51) Int. Cl.$^7$ .................................. H01J 61/26
(52) U.S. Cl. ........................ 313/553; 313/504
(58) Field of Search .................. 313/513, 504, 313/506, 503, 486, 489, 502, 507, 553, 559, 561

(56) References Cited

U.S. PATENT DOCUMENTS

| | | | | |
|---|---|---|---|---|
| 4,894,584 A | * | 1/1990 | Steinmann et al. | 313/557 |
| 5,247,190 A | | 9/1993 | Friend et al. | 257/40 |
| 5,328,336 A | * | 7/1994 | Nowobilski | 417/48 |
| 5,525,861 A | | 6/1996 | Banno et al. | 313/495 |
| 5,689,151 A | * | 11/1997 | Wallace et al. | 313/495 |
| 5,708,130 A | | 1/1998 | Woo et al. | 528/397 |
| 5,771,562 A | * | 6/1998 | Harvey, III et al. | 29/592.1 |
| 5,804,917 A | * | 9/1998 | Takahashi et al. | 313/504 |
| 5,882,761 A | | 3/1999 | Kawami et al. | 428/69 |
| 5,920,080 A | * | 7/1999 | Jones | 257/40 |
| 5,962,962 A | | 10/1999 | Fujita et al. | 313/412 |
| 6,054,808 A | * | 4/2000 | Watkins et al. | 313/495 |
| 6,069,443 A | * | 5/2000 | Jones et al. | 313/504 |
| 6,307,317 B1 | * | 10/2001 | Codama et al. | 313/504 |

FOREIGN PATENT DOCUMENTS

| | | |
|---|---|---|
| JP | 4363890 | 12/1992 |
| JP | 541281 | 2/1993 |
| JP | 5114486 | 5/1993 |

OTHER PUBLICATIONS

R. H. Friend, "Optical Investigations of Conjugated Polymers", 4 Journal of Molecular Electronics 37–46 (1988).

Junji Kido et al., "Organic Electroluminescent Devices Based on Molecularly Doped Polymers", 61 Appl. Phys. Lett. 761–763 (1992).

Gerrit Klarner et al., "Colorfast Blue Light Emitting Random Copolymers Derived from Di–n–hexylfluorene and Anthracene", 10 Adv. Mater. 993–997 (1998).

Chung–Chih Wu et al., "Efficient Organic Electroluminescent Devices Using Single–Layer Doped Polymer Thin Films with Bipolar Carrier Transport Abilities", 44 IEEE Trans. On Elec. Devices 1269–1281 (1997).

* cited by examiner

*Primary Examiner*—Robert H. Kim
*Assistant Examiner*—Jurie Yun
(74) *Attorney, Agent, or Firm*—Toan P. Vo; Noreen C. Johnson

(57) ABSTRACT

The invention relates to an organic light emitting device comprising a first conductor, a organic light emitting layer overlying the first conductor which emits light of a characteristic wavelength, a second conductor overlying the organic light emitting layer, and a transparent or substantially transparent substrate overlying at least one of the conductors. The substrate comprises dispersed particles of a getter material in an amount effective to protect the organic light emitting layer from being damaged by oxygen and/or water during a desired period of operation. The getter material has a particle size small enough that is smaller than the characteristic wavelength of the emitted light, so as to maintain the transparency or substantial transparency of the substrate. A method for making the device is also disclosed.

38 Claims, 3 Drawing Sheets

PLASTIC SUBSTRATES WITH IMPROVED BARRIER PROPERTIES FOR DEVICES SENSITIVE TO WATER AND/OR OXYGEN, SUCH AS ORGANIC ELECTROLUMINESCENT DEVICES

BACKGROUND OF THE INVENTION

The present invention relates generally to devices sensitive to water and/or oxygen, such as organic electroluminescent devices. More particularly, the present invention relates to substrates with improved barrier properties for organic electroluminescent display devices.

Organic light emitting devices (OLEDs) typically comprise a laminate formed on a substrate such as glass or silicon. A light-emitting layer of a luminescent organic solid, as well as optional adjacent semiconductor layers, is sandwiched between a cathode and an anode. The semiconductor layers may be hole-injecting or electron-injecting layers. The light-emitting layer may be selected from any of a multitude of fluorescent organic solids. The light-emitting layer may consist of multiple sublayers or a single blended layer.

When a potential difference is applied across the anode and cathode, electrons move from the cathode to the optional electron-injecting layer and finally into the layer(s) of organic material. At the same time, holes move from the anode to the optional hole-injecting layer and finally into the same organic light-emitting layer(s). When the holes and electrons meet in the layer(s) of organic material, they combine, and produce photons. The wavelength of the photons depends on the material properties of the organic material in which the photons are generated. The color of light emitted from the OLED can be controlled by the selection of the organic material, or by the selection of dopants, or by other techniques known in the art. Different colored light may be generated by mixing the emitted light from different OLEDs. For example, white light can be produced by mixing blue, red, and green light.

In a typical OLED, either the anode or the cathode is transparent in order to allow the emitted light to pass through. If it is desirable to allow light to be emitted from both sides of the OLED, both the anode and cathode can be transparent.

U.S. Pat. No. 5,962,962 describes a basic organic light emitting device. The OLED has a structure in which an anode, an organic light emitting layer, and a cathode are consecutively laminated, with the organic light emitting layer sandwiched between the anode and the cathode. Generally, electrical current flowing between the anode and cathode passes through points of the organic light emitting layer and causes it to luminesce. The electrode positioned on the surface through which light is emitted is formed of a transparent or semi-transparent film. The other electrode is formed of a specific thin metal film, which can be a metal or an alloy.

OLEDs typically have a number of beneficial characteristics, including a low activation voltage (about 5 volts), fast response when formed with a thin light-emitting layer, high brightness in proportion to the injected electric current, high visibility due to self-emission, superior impact resistance, and ease of handling of the solid state devices in which they are used. OLEDs have practical application in television, graphic display systems, digital printing and lighting. Although substantial progress has been made in the development of OLEDs to date, additional challenges remain. For example, OLEDs continue to face challenges associated with their long-term stability. In particular, during operation the layers of organic film may undergo recrystallization or other structural changes that adversely affect the emissive properties of the device.

One of the factors limiting the widespread use of organic light emitting devices has been the fact that the organic polymers or small molecule materials making up the device as well as, in some cases, the electrodes, are environmentally sensitive. In particular, it is well known that device performance degrades in the presence of water and oxygen. Exposing a conventional OLED to the atmosphere shortens its life. The organic material in the light-emitting layer(s) reacts with water vapor and/or oxygen. Lifetimes of 5,000 to 35,000 hours have been obtained for evaporated films and greater than 5,000 hours for polymers. However, these values are typically reported for room temperature operation in the absence of water vapor and oxygen. Lifetimes associated with operations outside these conditions are typically much shorter.

This fault tendency has especially limited the use of mechanically flexible plastic substrates for organic electroluminescent devices, because plastics are generally highly permeable to water and oxygen. Thus, mechanically flexible organic electroluminescent devices have not been available for practical applications.

Some attempts at preventing degradation have focused on removing the heat generated during device illumination. For example, Japanese Patent JP 4-363890 discloses a method in which an organic light emitting device is held in an inert liquid compound of liquid fluorinated carbon. Other efforts have been directed at removing the water that is one of the causes of degradation. JP 5-41281 discloses a method in which an organic light emitting device is held in an inert liquid compound prepared by incorporating a dehydrating agent such as synthetic zeolite into liquid fluorinated carbon (specifically, the same as the liquid fluorinated carbon disclosed in the above JP 4-363890). Further, JP 5-114486 discloses a method in which a heat-radiating layer encapsulating a fluorocarbon oil (specifically, included in the liquid fluorinated carbon disclosed in the above JP-A-4-363890) is formed on at least one of the anode and the cathode, and heat generated during illumination is radiated through the heat-radiating layer to extend the light emission life of the device. However, this method entails additional and difficult manufacturing steps.

Attempts have been made to coat plastics with various inorganic layers to provide a barrier to water and/or oxygen diffusion. For plastic substrates that hold the possibility of being mechanically flexible, the main efforts have involved depositing an inorganic coating such as $SiO_2$ or $Si_3N_4$ onto the plastic. However, to date, an adequate system has not been found to prevent degradation of the illumination device. The reason for this is due to imperfections such as pinholes in the inorganic coating. These imperfections provide a path for water and/or oxygen entry. It should be noted that even if an organic coating can be applied without imperfections, imperfections such as cracks often develop during thermal cycling due to the large mismatch in thermal expansion rates for plastics and inorganic coatings.

There are numerous designs of late to minimize water and oxygen diffusion into the active organic electroluminescent device region that have been utilized for rigid devices that do not utilize plastic substrates. One method is to fabricate the device on a glass substrate and then to sandwich it between another glass slide. In this design, because glass has excellent barrier properties for water and oxygen, the weak point in the design is usually the material used to join the glass substrate to slide. Another method described in U.S. Pat. No. 5,882,761 is to fabricate the device on a glass substrate and then to encase the whole device in an airtight chamber filled with a desiccant/drying agent. Another method described in U.S. Pat. No. 5,962,962 is to encase the device in an inert liquid barrier layer.

It would be desirable to provide a substrate with improved barrier properties for organic light emitting devices that could prevent premature deterioration of the elements of the OLED due to permeated water and oxygen without interfering with the light transmission from the OLED. It would also be desirable to provide such a device which was flexible.

BRIEF SUMMARY OF THE INVENTION

Plastic substrates for a device sensitive to water and/or oxygen, such as an organic light emitting device, with increased resistance to water and/or oxygen are disclosed. The plastic substrates comprise a transparent or substantially transparent polymer filled with particles of a getter material having a particle size which is smaller than the characteristic wavelength of light emitted by the organic light emitting device, and thus small enough so as to maintain the substantial transparency of the substrate, generally but not necessarily having a size of less than 100 nanometers (nm).

Also disclosed is a method of protecting a device sensitive to water and/or oxygen comprising applying to at least one surface of the sensitive device, so as to form a seal, a substrate layer comprising a transparent or substantially transparent polymer and getter particles dispersed within the transparent polymer, wherein the getter particles have a particle size which is substantially smaller than the characteristic wavelength of light emitted by the light emitting device, and thus small enough to maintain the substantial transparency of the substrate, generally but not necessary having a size less than 100 nm.

BRIEF DESCRIPTION OF THE DRAWINGS

The features and advantages of the present invention can be understood more completely by reading the following detailed description of preferred embodiments in conjunction with the accompanying drawings, in which like reference indicators are used to designate like elements, and in which.

DETAILED DESCRIPTION OF THE INVENTION

Figure 1:
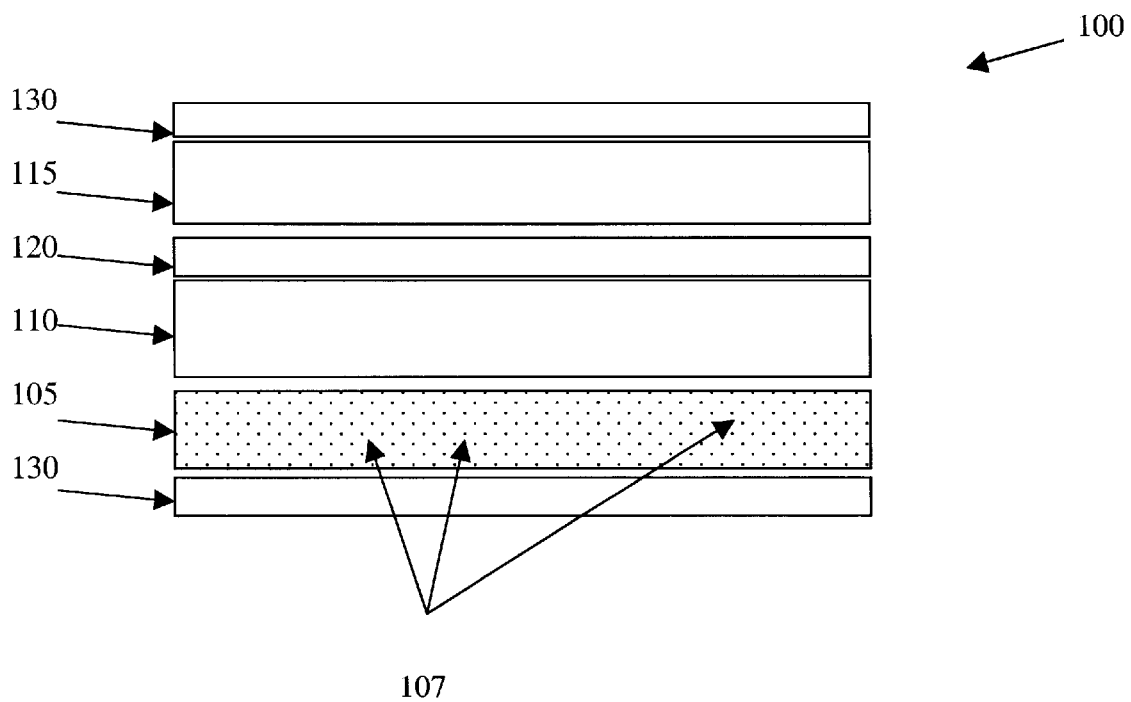
FIG. 1 is a side perspective view of an organic light emitting device according to an exemplary embodiment of the invention.

Plastic substrates for devices which are sensitive to water and/or oxygen, especially organic light emitting devices with increased resistance to water and/or oxygen, are disclosed. Although the discussion of the preferred embodiments relates to organic light emitting devices, it will be understood that it is in fact applicable to any device, especially those emitting light, which are sensitive to water and/or oxygen.

By "organic light emitting device" is meant a device comprising an organic light emitting layer sandwiched between an anode and a cathode. Typically, the organic light emitting layer comprises an electroluminescent organic solid which fluoresces when subjected to a current. Numerous such materials are known in the art, and the present invention is not limited to a particular one.

Generally, the organic light emitting device is provided as a luminescent display which includes an organic light emitting layer disposed between two electrodes, e.g., a cathode and an anode. The anode and cathode inject charge carriers, i.e., holes and electrons, into the organic light emitting layer where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer typically has a thickness of about 50–500 nanometers, and the electrodes each typically have a thickness of about 100–1000 nanometers.

The cathode generally comprises a material having a low work function value such that a relatively small voltage causes emission of electrons from the cathode. The cat ho de may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode typically comprises a material having a high work function value. The anode is preferably transparent so that light generated in the organic light emitting layer can propagate out of the luminescent display. The anode may comprise, for example, indium tin oxide (ITO), tin oxide, nickel, or gold. The electrodes can be formed by conventional vapor deposition techniques, such as evaporation or sputtering, for example.

A variety of organic light emitting layers can be used in conjunction with exemplary embodiments of the invention. According to one embodiment, the organic light emitting layer comprises a single layer. The organic light emitting layer may comprise, for example, a conjugated polymer which is luminescent, a hole-transporting polymer doped with electron transport molecules and a luminescent material, or an inert polymer doped with hole transporting molecules and a luminescent material. The organic light emitting layer may also comprise an amorphous film of luminescent small organic molecules which can be doped with other luminescent molecules.

Alternatively, the organic light emitting layer may comprise two or more sublayers which carry out the functions of hole injection, hole transport, electron injection, electron transport and luminescence. Only the luminescent layer is required for a functioning device. However, the additional sublayers generally increase the efficiency with which holes and electrons recombine to produce light. Thus the organic light emitting layer can comprise 1–4 sublayers including, for example, a hole injection sublayer, a hole transport sublayer, a luminescent sublayer, and an electron injection sublayer. Also, one or more sublayers may comprises a material which achieves two or more functions such as hole injection, hole transport, electron injection, electron transport, and luminescence.

Embodiments in which the organic light emitting layer comprises a single layer will now be described.

According to a first embodiment, the organic light emitting layer comprises a conjugated polymer. The term conjugated polymer refers to a polymer which includes a delocalized pi-electron system along the backbone of the polymer. The delocalized pi-electron system provides semiconducting properties to the polymer and gives it the ability to support positive and negative charge carriers with high mobilities along the polymer chain. The polymer film has a sufficiently low concentration of extrinsic charge carriers than on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g., replacing the phenylene ring with an anthracene or naphthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. The fluorenes, oligomers and polymers are substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference.

According to a second embodiment of a single layer device, the organic light emitting layer comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methylmethacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum(III) (Alq). TDP has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g., an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers," 61 Appl. Phys. Lett. 761–763 (1992), which is hereby incorporated by reference.

According to another embodiment of the invention, the organic light emitting layer comprises two sublayers. The first sublayer provides hole transport, electron transport, and luminescent properties and is positioned adjacent the cathode. The second sublayer serves as a hole injection sublayer and is positioned adjacent the anode. The first sublayer comprises a hole-transporting polymer doped with electron transporting molecules and a luminescent material, e.g., a dye or a polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprises the organic dyes coumarin 460 (blue), coumarin 6 (green), or nile red. The above materials are available commercially, for example from Aldrich Chemical Inc., Lancaster Synthesis Inc., TCI America, and Lambda Physik Inc. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities," 44 IEEE Trans. On Elec. Devices 1269–1281 (1997), which is hereby incorporated by reference.

According to exemplary embodiments of the invention, a plastic substrate is provided, e.g., for an OLED, which substrate comprises a transparent polymer filled with getter particles. The size of the getter particles is substantially smaller than the characteristic wavelength of light emitted by the OLED. Typically, the particle size is less than 200 nm, preferably less than 100 nm. The getter particles act to absorb water and/or oxygen without interfering with material transparency. The plastic substrate may be placed on one or both sides of the OLED. In another embodiment, the plastic substrate is coated with a transparent inorganic film.

The plastic substrate can be made from any transparent plastic that exhibits the desired physical properties, such as ability to contain the getter particles while at the same time retaining the desired combination of strength, size and/or flexibility/rigidity properties. Examples of materials which can be used for the substrate include transparent thermoplastics and thermosets, more particularly, materials such as polyethylene terephthalate, polycarbonate, silicone, or polymethylmethacrylate. The substrate layer should be sufficiently thick so as to provide a protective covering containing a sufficient amount of getter particles to obtain a desired prolongation of the life of the water and/or oxygen sensitive material, but not so thick such that it interferes with the operation of the water and/or oxygen sensitive device underlying it.

The getter particles which act to absorb water and/or oxygen, as indicated above, are chosen to have a size that is substantially less than the characteristic wavelength of light emitted by the OLED. Particles in this size range do not effectively scatter the light emitted by the OLED, and hence do not interfere with the transparency of the substrate material. The characteristic wavelength is defined as the wavelength at which the peak intensity of the OLED output light spectrum occurs. The size of the getter particles is typically less than ½, and preferably less than ⅕, of the characteristic wavelength. Typically, these ratios correspond to particle sizes of less than 200 nm, and preferably less than 100 nm. In some circumstances, somewhat larger particles can be desirable, for example where it is desired to have some scattering of the emitted light.

The materials for use as the "getters" for water and/or oxygen can be selected from those conventionally known to have such function, including certain alkaline earth metal oxides. They include, but are not limited to, BaO, SrO, CaO and MgO. Additionally, the getter particles can be selected from various metallic elements such as Ti, Mg, Ba, and Ca. Typically, it is desirable to employ the maximum amount of absorbent particles (in order to maximize the ability of the substrate to scavenge for water and/or oxygen) without causing a substantial diminution in transparency or other desired physical properties of the substrate material. The transparency of the filled substrate is typically chosen such that less than 50% of the light emitted by the OLED is absorbed in the substrate and preferably less than 10%. The getter particles are added into a transparent thermoplastic or thermoset such as polyethylene terepthalate, polycarbonate, silicone, or polymethylmethacrylate, for example. This process of adding getter particles can be carried out by a conventional mixing process such as one employing a Banbury mixer. If desired, the getter particles may be surface treated to inhibit agglomeration.

The resulting polymer substrate may optionally be coated with an additional layer serving as a barrier to $O_2$ and $H_2O$. Such barrier layer may comprise, for example, an inorganic coating such as $SiO_2$ or $Si_3N_4$. The coating is applied, for example, by chemical vapor deposition or by lamination.

An organic light emitting device can then be fabricated onto the resulting coated polymer substrate. Conversely, such a substrate can be added to an already completed OLED.

A second polymer substrate as described above can be deposited on a second side of the device in order to completely encapsulate the device. The selection criteria for the second polymer substrate are generally the same as for the first polymer substrate. If transparency is only required for one side of the device, then the getter particles for the non-transparent side do not have to be less than 100 nm.

FIG. 1 discloses an OLED constructed according to an exemplary embodiment of the invention. The OLED 100 includes a substrate 105 and a first conductor 110 overlying the substrate 105. Overlying the first conductor 110 is a second conductor 115. Sandwiched between the conductor layers is an organic light emitting layer 120. Overlying the conductors 110, 115 and the organic light emitting layer 120 is a top coating 130. The top coating 130 is typically transparent and provides sealing and protection for the entire OLED. It is preferably made of transparent inorganics, such as $SiO_2$ or $Si_3N_4$.

The substrate 105 is typically substantially planar and underlies and provides support for the entire OLED structure. The substrate, however, can also have a nonplanar or curved surface and can be flexible, if desired. The first and second conductors 110 and 115 may function as either electron injecting or hole injecting layers. When the holes and electrons from the conductors meet in the organic light emitting layer 120, light is emitted. The OLED 100 may emit light through either the top coating 130 or the substrate 105.

The substrate 105 is typically made of a transparent thermoplastic such as polyethylene terepthalate, polycarbonate or polymethylmethacrylate. Getter particles 107 are dispersed in the substrate material in an approximately random manner. The getter materials preferably have a particle size less than 100 nm (i.e., "nanoparticles") so that they do not interfere with the transparency of the substrate material. Examples of such nanoparticles that are commercially available (from Nanophase Technologies Corporation) include BaO, SrO, CaO, and MgO. Other compounds such as alkaline metal oxides, sulfates, metal halides, and perchlorates with particle sizes less than 100 nm can also be utilized.

The substrate 105 is coated with an inorganic top coating 130 such as $SiO_2$ or $Si_3N_4$. This coating seals the device and prevents significant intrusion of water and oxygen molecules. When oxygen or water molecules (not shown) eventually pass into the substrate, the molecules may be absorbed by the getter particles 107, preventing damage to the OLED 100.

Figure 2:
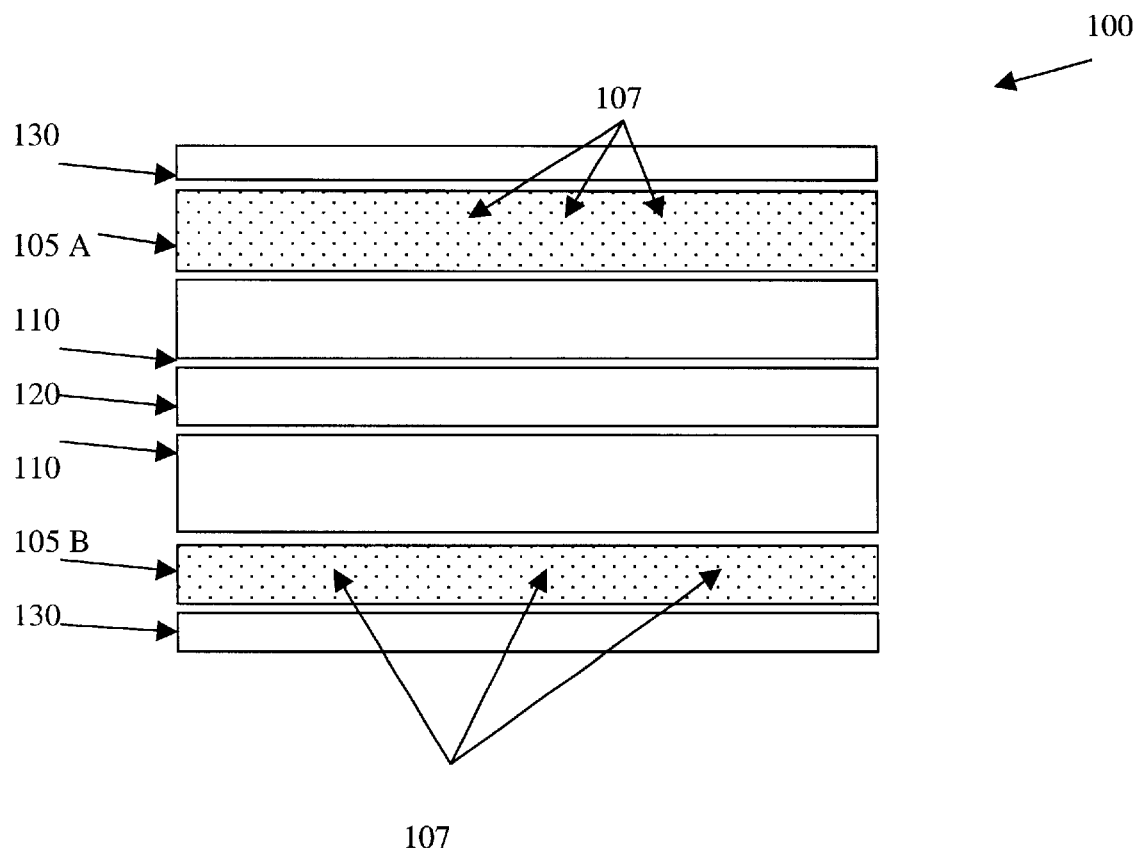
FIG. 2 is a side perspective view of an organic light emitting device according to another embodiment of the invention.

FIG. 2 shows a cross section of another embodiment of the invention. In FIG. 2, the OLED 100 includes substrates 105A, 105B on opposite sides of the OLED. This doubling of the substrate increases the protection of the OLED 100 against air and water permeation. Also, although not shown in FIG. 2, the OLED could easily be completely encased in substrate material, which would provide maximum protection against oxygen and water permeation.

While both substrates 105A, 105B are shown identically in FIG. 2, if one side of the OLED 100 does not allow light through by design, the transparency of the substrate on that side is not important, and the getter particles 107 would not then need to have a size so as to maintain the transparency of the substrate.

Figure 3:
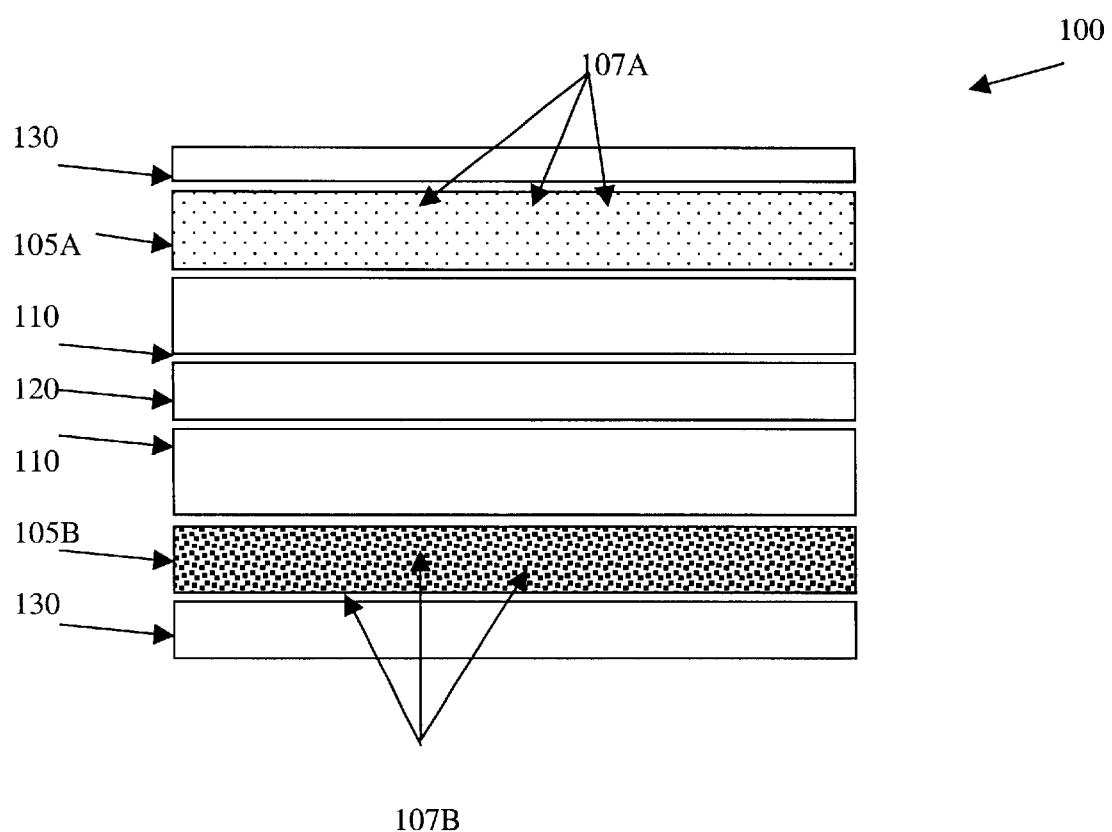
FIG. 3 is a side perspective view of an organic light emitting device according to another embodiment of the invention.

Such an arrangement is shown in FIG. 3. Here, substrate 105A comprises dispersed getter particles 107A of less than 100 nm in diameter, and will thus pass substantially all light that is projected at it. However, a second substrate 105B is not required to pass light in this particular embodiment, and therefore contains getter particles 107B of greater than 100 nm in diameter. While the light transmittance through the second substrate 105B is substantially muted or blocked, this does not detract from the performance of the OLED, because light was not designed to travel through this end.

The resulting device is expected to exhibit a longer life than a device with an inorganic coating alone because the getter particles within the substrate act to absorb water and/or oxygen that make it through imperfections in the inorganic coating layer. Moreover, such a distribution of getter particles in the substrate layer will allow much greater transmittance of light than a solid layer of getter material, maintaining the efficiency of the OLED.

While the foregoing description includes many details, it is to be understood that these have been included for purposes of explanation only, and are not to be interpreted as limitations of the present invention. Many modifications to the embodiments described above can be made without departing from the spirit and scope of the invention, as is intended to be encompassed by the following claims.

What is claimed is:

1. An organic light emitting device, comprising:
   a first conductor;
   an organic light emitting layer overlying the first conductor which emits light of a characteristic wavelength;
   a second conductor overlying the organic light emitting layer; and
   a transparent or substantially transparent substrate overlying at least one of the conductors, the substrate comprising dispersed particles of a getter material in an amount effective to protect the organic light emitting layer from being damaged by oxygen and/or water during a desired period of operation, the getter material having a particle size less than the characteristic wavelength of the light emitted by the organic light emitting layer, so as to maintain the transparency or substantial transparency of the substrate.

2. The device of claim 1, wherein the substrate, including the getter material, is transparent.

3. The device of claim 1, wherein the substrate, including the getter material, is substantially transparent and causes some diffusion of light.

4. The device of claim 1, wherein the getter particles have a size which is less than one half the characteristic wavelength.

5. The device of claim 1, wherein the getter particles have a size which is less than one fifth the characteristic wavelength.

6. The device of claim 1, wherein the getter particles are less than about 200 nanometers in diameter.

7. The device of claim 1, wherein the getter particles are less than about 100 nanometers in diameter.

8. The device of claim 2, wherein the getter particles comprise a material effective at absorbing oxygen and water molecules that pass into the substrate layer.

9. The device of claim 8, wherein the getter particles comprise alkaline earth metal oxides, sulfates, halides, or perchlorates.

10. The device of claim 9, wherein the getter particles comprise BaO, SrO, CaO, or MgO.

11. The device of claim 1, wherein the getter particles comprise at least one of Ti, Mg, Ba, or Ca.

12. The device of claim 1, wherein the substrate comprises a thermoplastic material.

13. The device of claim 12, wherein the thermoplastic material is a polyester, a silicone, or a polycarbonate.

14. The device of claim 1, further comprising a transparent or substantially transparent substrate overlying both of the conductors.

15. The device of claim 1, further comprising a transparent or substantially transparent substrate over one of the conductors and a substrate which is not transparent or substantially transparent over the other conductor.

16. The device of claim 15, wherein the substrate which is not transparent or substantially transparent comprises particles of a size greater than 100 nanometers.

17. The device of claim 1, further comprising a barrier layer overlying the transparent or substantially transparent substrate.

18. The device of claim 17, further comprising a second substrate and a barrier layer overlying the second substrate.

19. The device of claim 17, wherein the barrier layer comprises $SiO_2$ or $Si_3N_4$.

20. A method of protecting a device sensitive to water and/or oxygen, comprising applying to at least one surface of the device, so as to form a seal, a substrate layer comprising a transparent or substantially transparent polymer and getter particles dispersed within the transparent polymer, wherein the getter particles are present in an amount effective to protect the device from being damaged by oxygen and/or water during a desired period of operation, the getter particles having a particle size small enough so as to maintain the transparency or substantial transparency of the substrate.

21. The method of claim 20, wherein the device sensitive to water and/or oxygen is an organic light emitting device which emits light of a characteristic wavelength.

22. The method of claim 21, wherein the getter particles have a size which is less than one half of the characteristic wavelength.

23. The method of claim 21, wherein the getter particles have a size which is less than one fifth of the characteristic wavelength.

24. The method of claim 20, wherein the getter particles are less than 200 nanometers in diameter.

25. The method of claim 20, wherein the getter particles are less than 100 nanometers in diameter.

26. The method of claim 20, wherein the getter particles are effective at absorbing substantially all oxygen and water molecules that pass into the substrate layer.

27. The method of claim 20, wherein the getter particles are alkaline earth metal oxides, sulfates, halides, or perchlorates.

28. The method of claim 27, wherein the getter particles comprise BaO, SrO, CaO, or MgO.

29. The method of claim 20, wherein the getter particles comprise at least one of Ti, Mg, Ba, or Ca.

30. The method of claim 20, wherein the substrate comprises a thermoplastic material.

31. The method of claim 30, wherein the thermoplastic material is a polyester, a silicone, or a polycarbonate.

32. The method of claim 20, wherein said device comprises an organic light emitting layer disposed between two conductors, and said method further comprises applying a transparent or substantially transparent substrate over both of the conductors.

33. The method of claim 20, wherein said device comprises an organic light emitting layer disposed between two conductors, and said method further comprises applying a transparent or substantially transparent substrate over one of the conductors and a substrate which is not transparent over the other conductor.

34. The method of claim 33, wherein the substrate which is not transparent or substantially transparent comprises particles of a size greater than 100 nanometers.

35. The method of claim 20, further comprising the step of applying a barrier layer overlying the transparent or substantially transparent substrate.

36. The method of claim 35, comprising applying the barrier layer by vapor deposition.

37. The method of claim 20, further comprising the step of applying a second substrate and a barrier layer overlying the second substrate.

38. The method of claim 35, wherein the barrier layer comprises $SiO_2$ or $Si_3N_4$.

* * * * *